March 17, 1964 J. E. ALLEGRETTI ETAL 3,125,533

SEMICONDUCTOR PROCESS

Filed Aug. 4, 1961

INVENTOR
JOHN E. ALLEGRETTI
JOSEPH WALDMAN

BY

ATTORNEY

United States Patent Office 3,125,533

Patented Mar. 17, 1964

3,125,533
SEMICONDUCTOR PROCESS

John E. Allegretti, Lawrence Brook Village, East Brunswick, N.J., and Joseph L. Waldman, Brooklyn, N.Y., assignors to Merck & Co., Inc., Rahway, N.J., a corporation of New Jersey Filed Aug. 4, 1961, Ser. No. 129,468
3 Claims. (Cl. 252—62.3)

This invention relates to a method for preparing semiconductor bodies and, more particularly, to a method of introducing P-type acceptor atoms into a semiconductor body from the vapor phase in a predetermined concentration in the range of 1 ohm-cm. or greater.

The process of deposition of semiconductor material and active impurities therewith from the vapor phase by simultaneous thermal decomposition of semiconductor and acceptor compounds is well known in the art. For example, it is known that P-type semiconductors of relatively low resistivity may be prepared in this manner. In the preparation of such bodies from the vapor phase a predetermined concentration of active impurities in the vapor phase will provide an empirically determined lesser concentration of impurities in the deposited semiconductor layer thus obtained. The percentage conversion of impurities from the vapor phase to the deposited layer is observed to be fairly constant over a wide concentration range of impurities added. However, when it is desired to grow P-type semiconductor bodies having an exceedingly low concentration of P-type acceptor atoms, i.e., semiconductor bodies having a resistivity in the range of about 1 ohm-cm. or greater, the normal conversion relationship does not hold. In fact, in this concentration range the conversion yield drops off rather sharply and quickly a condition is reached in the low concentration range wherein the amount of impurities in the deposited layer cannot even be detected. In other words, the impurities added in the vapor phase do not find their way into the deposited semiconductor body. Accordingly, the present invention is concerned with the problem of the preparation by growth from the vapor phase of such low concentration P-type semiconductor bodies.

An object of the present invention is to provide a vapor-deposited P-type semiconductor body having a resistivity in the order of 1 ohm-cm. or greater.

Still another object of this invention is to provide a method of introducing P-type acceptor atoms into a semiconductor body in predetermined concentrations from the vapor phase to provide a body having a resistivity in the range of about 1 ohm-cm. or greater.

A specific object of the present invention is to provide a method of controlled P-type doping of trichlorosilane with boron trichloride to provide a semiconductor body having a resistivity within the range of about 1 ohm-cm. or greater.

These and other objects will be made apparent from the following more detailed description of the invention in which reference will be made to the accompanying drawings in which.

In accordance with the present invention there is provided a method for the preparation of P-type semiconductor bodies having the aforementioned low concentration of acceptor atoms. The method described herein is based upon the discovery that certain agents are present in commercial forms of thermally decomposable semiconductor compounds, for example, trichlorosilane, which complex or otherwise inactivate the acceptor compound, for example, boron trichloride, so that the latter does not thermally decompose within the reactor system as expected. Such agents generally are of the siloxane type. Accordingly, in one form of the present invention an excess of boron trichloride is added to trichlorosilane, part of which functions to complex this agent, and the rest to provide a predetermined concentration of acceptor atoms to form a semiconductor body having a resistivity of about 1 ohm-cm. or greater. In a preferred form of the method of the present invention, the excess boron trichloride is removed by distillation from liquid trichlorosilane, and then controlled, predetermined low amounts of boron trichloride are added to trichlorosilane in a gas stream to provide the desired concentration of acceptor atoms.

Figure 1:
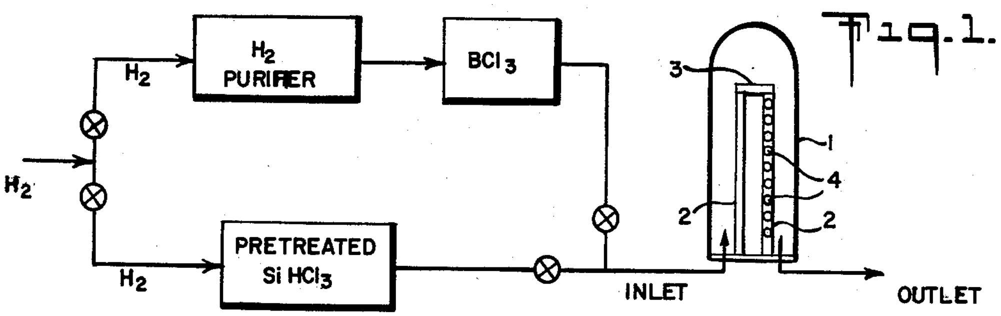
FIG. 1 is a schematic illustration of the apparatus used in the method of the present invention.

Referring now to FIG. 1, there is shown in highly schematic form the general process of growth from the vapor phase as used in the method of the present invention. What is shown therein is a preferred reactor system, such as that described in the co-pending application of Allegretti and Lago, Serial No. 53,578, filed August 24, 1960, although other such systems may be used as well.

The foregoing process may be employed in the formation of semiconductor bodies of known semiconductor materials with the only criterion being that a decomposable vapor source of the material be available. The terms "thermally decomposable," "thermal decomposition" and the associated deposit of a product of decomposition, as used herein, are intended to be generic to the mechanisms of heat-cracking as, for example, the decomposition of silicon tetrachloride and liberation of silicon atoms through the action of heat alone and the mechanism of high temperature reactions wherein the high temperature causes interaction between various materials with liberation of specific materials or atoms as, for example, the reaction of $$3SiHCl_3 + H_2 \xrightarrow{\Delta} 2Si + SiCl_4 + 5HCl$$

used in the preferred embodiments of this invention as hereinafter indicated. For the sake of illustration, the following detailed description of apparatus used and crystal form obtained relates to the use of the invention in the formation of monocrystalline silicon semiconductor bodies.

The source of active impurity atoms is thermally decomposable volatile compounds of those elements known in the art to alter the intrinsic electrical properties of a semiconductor material by acting as P-type acceptor atoms in semiconductor bodies. Such elements include boron, aluminum, and gallium, as is known. Ideal success has been had with the use of boron trichloride in the formation of P-type bodies in accordance with the method of the invention, and because of ease of handling this material in the process it is preferred for appropriate silicon doping in commercial embodiments of this invention.

Within the reactor 1 is a heated substrate 2. The substrate is connected by conducting bridge 3 and heated by an electrical current (not shown). Semiconductor material may be deposited directly on the substrates or upon semiconductor wafers 4 positioned on the substrate. Such wafers may be of any desired conductivity type and degree.

The gases within the reactor system include a carrier gas, such as hydrogen, a thermally decomposable source of semiconductor material, such as trichlorosilane, and a P-type doping compound, such as boron trichloride. The hydrogen gas is first dried by passing it through a hydrogen purifier which removes any water vapor which is present in the gas. Suitably, a column which is packed with a water adsorbent, for example, a Linde molecular sieve, immersed in liquid nitrogen, may be used as a hydrogen purifier.

The dry hydrogen thus produced is then combined with controlled amounts of boron trichloride to produce a gas stream of boron trichloride of predetermined concentration. Then trichlorosilane which was pretreated in the manner to be described in detail hereinafter appropriately diluted with hydrogen is added to this gas stream and the combined gases are admitted into the reactor. Within the reactor, the gases are decomposed thermally, producing boron doped silicon semiconductor material having a controlled resistivity.

Figure 2:
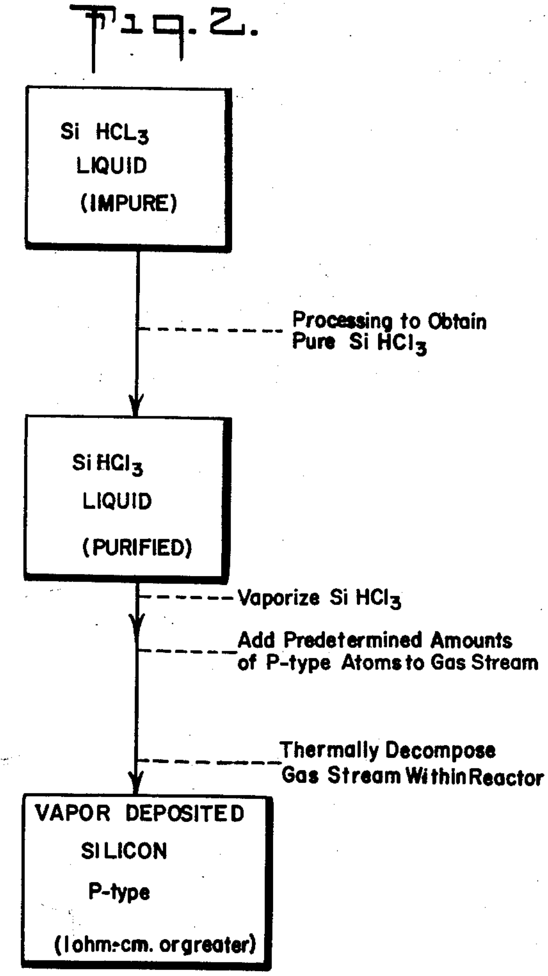
FIG. 2 is a flow sheet illustrating the method of the invention.

The flow sheet in FIG. 2 illustrates the general method of the present invention whereby silicon semiconductor material having resistivities within the range of about 1 ohm-cm. or greater may be produced. In particular, according to this method, the trichlorosilane is processed to obtain a purified form of the material for use in a vapor deposition process. Thereupon, predetermined amounts of the thus-purified trichlorosilane and boron trichloride may be decomposed simultaneously within the reactor to provide the desired semiconductor material.

Figure 3:
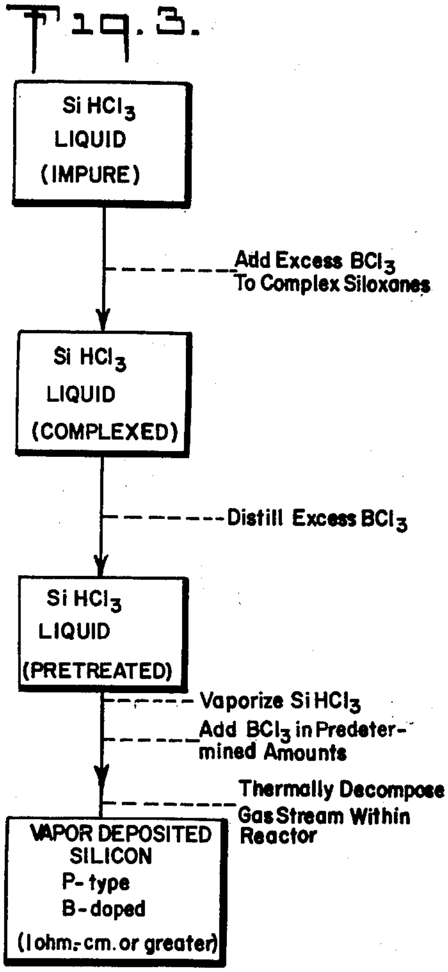
FIG. 3 is another flow sheet showing a preferred form of the invention.

A preferred manner of accomplishing this result is illustrated in the flow sheet of FIG. 3. Accordingly, an excess of boron trichloride is added to commercial, distilled liquid trichlorosilane, thereby complexing the siloxane agent present in the trichlorosilane. Then the excess boron trichloride is removed by distillation. Pure trichlorosilane is then vaporized for entry into the reactor. Thereafter, a controlled, predetermined concentration of boron trichloride is added with accuracy to the silicochloroform gas stream to provide the desired low concentration of boron doping material.

In a typical run which is described herein for purposes of illustration and not limitation, 0.128 ml. of gaseous boron trichloride is added by subsurface addition to 2,000 g. of predistilled trichlorosilane while the latter is immersed in Dry Ice to aid in the adsorption and to minimize the vaporization of trichlorosilane. The resultant solution is then refluxed for about 2¾ hours; thereafter 7½% of the silicochloroform is distilled off and discarded. Then hydrogen is passed over the trichlorosilane at a total flow rate of 5.5 liters per minute to vaporize 240 grams per hour of trichlorosilane. Under these conditions 11 grams of silicon are deposited per hour. To this gas stream is added boron trichloride diluted with hydrogen at a concentration in the amount of $4.08 \times 10^{17}$ atoms as $BCl_3$ per cc. of Si produced. This gas stream is then cracked within the reactor onto a silicon support to provide a deposited P-type silicon body having resistivity of 1 ohm-cm.

By appropriate linear addition of boron trichloride to trichlorosilane, a semiconductor body having a resistivity up to about 20 ohm-cm. may be conveniently produced. For example, using $1.61 \times 10^{16}$ atoms B as $BCl_3$ per cc. Si produced in the deposit, a semiconductor body having a resistivity of 20 ohms-cm. is formed. By adding $1.93 \times 10^{17}$, $7.0 \times 10^{16}$ and $3.33 \times 10^{16}$ atoms B as $BCl_3$ per cc. Si produced, semiconductor bodies having resistivities of 2, 5 and 10 ohm-cm., respectively are formed.

While we have illustrated the invention with particular reference to silicon semiconductor material, it will be understood that other semiconductor materials, such as germanium, may be used as well. Other decomposable silicon compounds, such as silicon tetrachloride, tetrabromide and tetraiodide, may be used in place of trichlorosilane.

What has been described herein is a method for treating the complexing agent within the decomposable semiconductor compound so as to render it free of the influence of said agent. A preferred method is described involving complexing said agent with an excess of the acceptor atom compound. It will be understood that other methods of removing said agent may be used as well. For example, a compound other than the actual acceptor compound may be used to initially complex this agent. Furthermore, the agent may be precipitated from the gas phase by addition of a complexer which forms an insoluble compound in the gas phase with the agent. For example, gallium trichloride produces such an insoluble material with commercial trichlorosilane.

While the present invention has been described with reference to certain embodiments thereof, it will be understood by those skilled in the art that other modifications and changes may be made which are within the skill of the art. Accordingly, it is contended that applicants should be limited only to the claims which follow.

What is claimed is:

1. A method for the production of a P-type semiconductor body having a resistivity of at least 1 ohm-cm. by simultaneous thermal deposition of semiconductor and a low concentration of P-type acceptor atoms from the vapor phase in the presence of hydrogen, said semiconductor having an agent present therein which ordinarily associates with said acceptor atoms in said low concentration range in a non-thermally decomposable form which comprises the steps of adding boron trichloride to liquid, predistilled, trichlorosilane in an amount in excess of that required to complex with said agent, distilling off the complex formed between said agent and said boron trichloride thereby rendering the remainder of said liquid substantially free of the influence of said agent, forming a gas stream of said thus-purified trichlorosilane, and introducing into said gas stream controlled, predetermined low concentrations of boron trichloride corresponding to the desired low concentration semiconductor body, and thereafter thermally decomposing said compounds from the vapor phase within a reactor onto a substrate to form said semiconductor body.

2. A method in accordance with claim 1 wherein said substrate is a semiconductor wafer.

3. A method for the production of a P-type semiconductor body having a resistivity of about 1 ohm-cm. by simultaneous thermal deposition of semiconductor and P-type acceptor atoms from the vapor phase, said semiconductor compound having an agent present therein which ordinarily associates with said acceptor atoms in said low concentration range in a non-thermally decomposable form which comprises the steps of adding 0.128 ml. of boron trichloride to 2000 grams of liquid, predistilled trichlorosilane, refluxing for about 2¾ hours, distilling off 7½% of said liquid thereby rendering the remainder of said liquid substantially free of said agent, forming a gas stream with hydrogen at a total flow rate of 5.5 liters per minute of said thus-purified trichlorosilane to vaporize 240 grams per hour of trichlorosilane, and introducing into said gas stream $4.08 \times 10^{17}$ atoms B as boron trichloride per cc. of silicon produced by dilution with dry hydrogen, and thereafter thermally decomposing said compounds from the vapor phase within a reactor onto a substrate to form said semiconductor body.

References Cited in the file of this patent

UNITED STATES PATENTS

| | | |
|---|---|---|
| 2,763,581 | Freedman | Sept. 18, 1956 |
| 2,970,111 | Hoffman et al. | Jan. 31, 1961 |
| 3,063,811 | Kniepkamp et al. | Nov. 13, 1962 |

OTHER REFERENCES

Wilson: Large Scale Preparation etc., Research, vol. 12, 1959, pages 91–96.